United States Patent [19]

Grovender

[11] 4,144,648
[45] Mar. 20, 1979

[54] CONNECTOR

[75] Inventor: Steven L. Grovender, Saint Paul, Minn.

[73] Assignee: Minnesota Mining and Manufacturing Company, Saint Paul, Minn.

[21] Appl. No.: 870,129

[22] Filed: Jan. 17, 1978

Related U.S. Application Data

[63] Continuation-in-part of Ser. No. 703,210, Jul. 7, 1976, abandoned.

[51] Int. Cl.² .................. H01R 13/54; H05R 1/12
[52] U.S. Cl. ...................... 339/75 M; 339/17 CF; 339/176 MP; 339/DIG. 3
[58] Field of Search ............ 339/17 C, 17 CF, 75 R, 339/75 M, 176 MP, DIG. 3; 338/99, 100, 112, 114

[56] References Cited

U.S. PATENT DOCUMENTS

| 3,335,327 | 8/1967 | Damon et al. | 339/17 CF X |
| 3,883,213 | 5/1975 | Glaister | 339/DIG. 3 X |

OTHER PUBLICATIONS

Technicolor Data Bulletin 970, Chomerics, Inc., Woburn Mass. Ref. Date 12-2-1974.

Primary Examiner—Roy Lake
Assistant Examiner—E. F. Desmond
Attorney, Agent, or Firm—Cruzan Alexander; Donald M. Sell; Edward T. Okubo

[57] ABSTRACT

A connector for the discrete connection of close-spaced contact pads on a leadless semiconductor package to either a printed circuit or to thick film traces is disclosed. The connector utilizes a conductive elastomer medium to insure electrical conductivity and/or electrical impedance matching.

6 Claims, 2 Drawing Figures

CONNECTOR

CROSS-REFERENCE TO RELATED APPLICATION

This is a continuation-in-part of application Ser. No. 703,210, filed July 7, 1976, now abandoned.

BACKGROUND OF THE INVENTION

The present invention relates to a connector for leadless integrated circuit (I.C.) carriers or packages, and comprises a fastener, a positioning frame and a retaining clip. Contact is made between the pads on a leadless I.C. package and a printed circuit board or hybrid substrate through an electrically anisotropic conductive elastomer sheet.

Mounting of an I.C. on a printing circuit board has traditionally been accomplished by soldering the "legs" of the well-known dual in-line package (DIP) directly to the board or by being plugged into a socket which has been soldered into place on the board. While soldering provides very reliable gas tight electrical connections, it also makes assembly and removal of the package difficult due to the necessity of applying heat. The heat necessary to form the solder connection is quickly conducted through the leads into the integrated circuit package which may cause overheating thereof. Overheating can cause cracks in the glass seal and can damage the integrated circuit. Heat also can warp and/or cause delamination of the printed circuit board. The application of heat is relatively easy to control during initial assembly of the circuit board under factory conditions. However, many costly elements and wiring board assemblies have been destroyed by the application of excessive heat at installation sites.

A relatively new package, the leadless carrier, offers a number of advantages over the traditional DIP. First, there are no legs which means lower initial cost and higher manufacturing yields. Second, leadless carriers are significantly smaller than equivalent DIPs which thus permits higher packaging densities and shorter lead lengths.

Just as with DIPs, unsoldering a leadless carrier at an installation site is very undesirable. Due to the problems of replacement inherent with solder connections, many types of demountable connectors have been developed which do not require the use of heat in the formation of the electrical connections. These connectors employ what may be called pressure contacts for the formation of the electrical connections.

In general, these connectors require solder leads or legs for the connector and require minimum contact centers of about 0.10 inch. Connection pads on the carrier may be formed either along the edge, top or bottom. In all cases, however, the pluggable connection is made by pressing individual metal contacts against pads on the carrier. The need for individual metal contacts has meant that the connector must inevitably be large enough to accommodate and separate each of the individual contacts. The contacts themselves must be large enough to supply adequate spring force to insure a good electrical connection. In addition to these size constraints, the precision stamping and assembly requirements have proved to be quite expensive.

From the foregoing it will be seen that a need exists for a connector for mounting a leadless integrated circuit package on a printed cicuit board.

SUMMARY OF THE INVENTION

The present invention relates to a connector for leadless I.C. carriers and comprises a fastener, a positioning frame and a retaining clip. Contact is made between the pads on a leadless I.C. package and a printed circuit board or hybrid substrate through an electrically anisotropic conductive elastomer sheet.

The fastener is suitably secured to the printed circuit board, typically by being soldered thereto. The board is provided with suitable apertures to receive the solder legs of the fastener to thereby provide both mechanical retention and position registration.

The position frame is nestably received within the fastener. The frame, in turn, receives a leadless I.C. carrier which is simply inserted into the frame. A sheet of electrically anisotropic conductive elastomer is placed beneath the positioning frame and rests directly upon the traces on the printed circuit board.

The retaining clip with its elastomer pressure pad is next snapped onto the assembled composite and locked thereto to complete assembly of the connector. During assembly, the elastomer pad is compressed against the top of the leadless I.C. carrier thereby providing an evenly distributed pressure on the carrier and on the underlying conductive elastomer sheet to establish electrical interconnection between the pads on the leadless I.C. carrier and the circuit board. It is understood, of course, that the pad configuration on the carrier matches the traces on the printed circuit board or hybrid substrate so that they will be in registration when in an assembled state.

Carrier removal from the connector is accomplished by prying open the retaining clip with a small screwdriver. The carrier can then be removed by inverting the connector or it can be lifted out of the connector with a small blade. A replacement carrier can then be inserted and the retaining clip replaced.

BRIEF DESCRIPTION OF THE DRAWINGS

In the accompanying drawings which illustrates the invention.

DETAILED DESCRIPTION OF THE INVENTION

Figure 2:
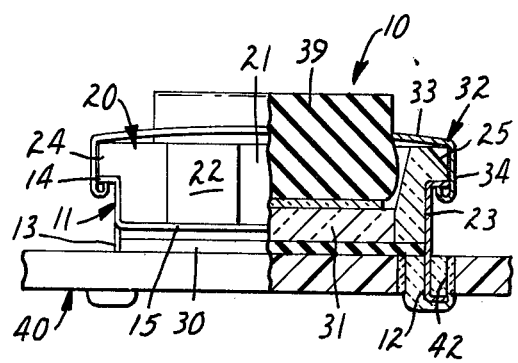
FIG. 2 is an enlarged sectional view of a printed circuit board having a leadless I.C. carrier mounted on the circuit board with a connector of the present invention.

Referring more particularly to the drawings, connector 10 comprises fastener 11, positioning frame 20, conductive elastomer sheet 30 and retaining clip 32.

Figure 1:
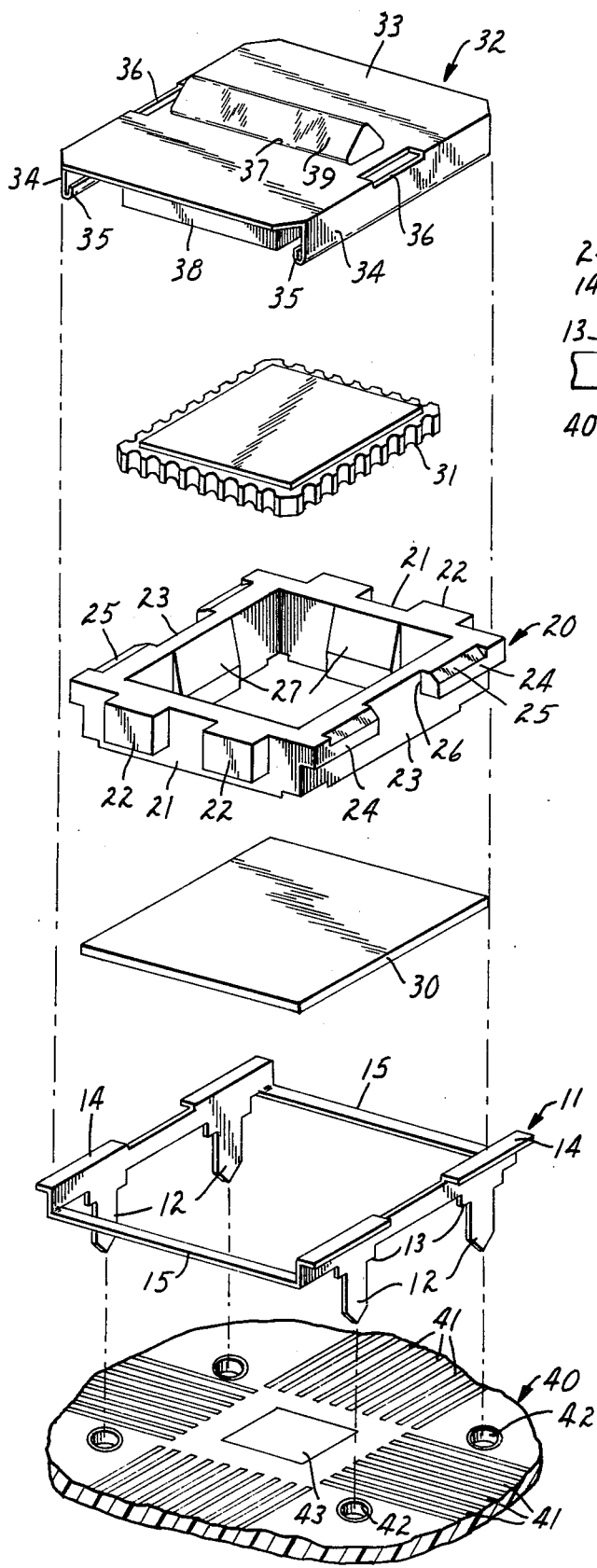
FIG. 1 is an isometric exploded view of the connector of the present invention showing the connector, a leadless I.C. carrier and a portion of a printed circuit board.

In the illustrated embodiment, fastener 11 is in the form of a frame stamped from a thin flat plate of cartridge brass, alloy 260, spring temper or other resilient metal and bent into the shape shown in FIG. 1. Legs 12 at each of the four corners of fastener 11 are formed with shoulders 13 which rest on the surface of printed circuit board 40, out of contact with traces 41, when legs 12 are inserted into apertures 42 and soldered into place. Fastener 11 is also provided with tabs 14 which serve as supports for positioning frame 20. Sides 15 of fastener 11 also serve as supports for frame 20.

Positioning frame 20 is in the form of a frame and is molded of a suitable insulating material such as polycarbonate, polypropylene and similar materials. Frame 20 is provided along its opposite paired sides 21,21 with square bosses 22 which rest on sides 15 of fastener 11 and serve as stops when frame 20 is nestably inserted thereinto. Paired sides 23,23 each has rectangular bosses 24 which rest on tabs 14 of fasteners 11 when connector 10 is assembled. Each boss 24 has a bevelled portion 25 which serves as a ramp for retaining clip 32. The bevelled portion 25 lies interiorly of the ends of each boss 24 and is formed by removing a 45° triangular segment from each boss. As can be clearly seen in FIG. 1, each boss 24 occupies approximately one-third of the lineal distance along the outer ends of side 23. The innermost edge of each boss 24 is coterminus with the innermost edge of tab 14 thus leaving the central one-third as slot 26, whose purpose will be explained hereinafter. Centrally located along the interior of each of sides 21,21 and 23,23 is a positioning ramp 27 which serves to center I.C. package 31 in positioning frame 20. Ramps 27 are gently sloped toward their tops and the bottom portion of the ramps is perpendicular to snugly receive leadless I.C. package 31.

A functionally homogeneous conductive elastomer sheet 30 is adhered to the bottom of positioning frame 20 with a non-conductive adhesive such as a silicone adhesive and is thus interposed between the I.C. carrier and the circuit board.

Conductive elastomers per se and their use in connectors are, of course, known (for example, see Comella, Elastomers That Conduct Electricity, *Machine Design*, pages 60-63, Aug. 21, 1975). A large percentage of the conductive elastomers utilized in electronic connectors has closely paralleled the use of conventional metal contacts and conductors since the individual conductive elements, i.e., the "contacts" and "conductors", are retained.

The present invention utilizes the anisotropic conduction characteristics of special elastomeric composites to effect electrical interconnection between electronic components. Instead of predetermined individual conductive elements, a functionally homogeneous sheet is used having properties such that many separate electrically conductive paths can be established per square inch upon compression, the sheet being essentially non-conductive in the free state. An anisotropically conductive elastomeric material found to be especially useful in the present invention is a functionally homogeneous composite comprising metal particles randomly dispersed throughout a non-conducting polymeric binder. Sheet thicknesses in the order of 0.005 inch to 0.030 inch have been used in connectors of the present invention. Useful conductive elastomer sheets contain between about 2.5 to about 5 volume percent spherical metal particles, preferably nickel, having a particle size of from about 0.006 to about 0.009 inch diameters dispersed in a silicon polymer. Each path has a through resistance of about one ohm and is isolated from other paths by a minimum of $10^9$ ohms. Thus, after the units to be connected are aligned and retained by the connectors, conductive paths are spontaneously formed between the opposed aligned contacts.

Retaining clip 32 is a two-part assembly comprising a stainless steel cover 33 which locks onto fastener 11 and a compressible elastomer pressure pad 38. Cover 33 is typically stamped from sheet stock and bent into the shape shown in FIG. 1. The corners of cover 33 have been removed as can be seen in FIG. 1 so that sides 34 will be foreshortened to clear the end of bosses 24 on sides 23. Sides 34 are formed with turned-under edges 35 to ease riding along ramps 25 and to engage the bottoms of tabs 14 to lock the connector 10 together. Cover 33 is provided with paired central slots 36 along and adjacent to sides 34. Slots 36 are aligned with slots 26 in positioning frame 20 when connector 10 is in its assembled and locked condition. Unlocking of the connector is accomplished by inserting a small screwdriver blade into slot 36 and applying a prying force against side 34. This action will force edge 35 to clear tabs 14 so that clip 32 can be removed.

Cover 33 is also provided with a transverse slot 37 extending between slots 36 and into which triangular locking tab 39 of pressure pad 38 is force fitted thus securing pressure pad 38 to cover 33. Attachment of pressure pad 38 to cover 33 in this manner serves not only to align and position the pressure pad but also prevents canting of leadless I.C. package 31 in connector 10.

In order for pressure pad 38 to perform the necessary functions of uniform pressure on leadless I.C. package 31, to insure circuit integrity and to provide the necessary resistance to vibration and shock, it should have a Shore "A" Durometer of about 40 to 50. Softer compounds tend to shift when compressed and harder ones require close dimensional tolerances thus increasing the cost of the connector. Another criterion is that pressure pad 38 should be compressed about 8 to 10% of its thickness when the connector is in its assembled condition. Finally, pressure pad 38 should be large enough in area to cover the entire top surface of leadless I.C. package 31 so that a uniform pressure is applied over the entire carrier top.

After observing failures in several prototype connectors characterized by shorted contacts along one edge of the I.C. package and open contacts along the opposite edge, it was concluded that the I.C. package was slightly canted. Since it is known that the contact pressure along any single edge is inversely proportional to the contact surface area, a small registration error results in a large pressure difference between opposite edges. Accordingly, it was concluded that the edge with the higher pressure squeezed the conductive elastomer to the point that it shorted while the edge with the lower pressure made poor or no contact through the relatively uncompressed elastomer.

One solution to this canting problem lay in modifying the geometry of the printed circuit board trace pattern by etching an additional pad 43 at the center of the original trace pattern 41. By this seemingly simple expedient, the sensitivity of the connector 10 to the position of carrier 31 in the positioning frame 20 is dramatically reduced.

The connector 10 of the present invention electrically interconnects the I.C. package 31 to the printed circuit board 40 by pressing the I.C. package firmly against the board. Electrical connection between the conductive pads (not shown) on the I.C. package 31 and the traces 41 on the printed circuit board 40 is effected by the thin sheet of conductive elastomer 30 which is squeezed between the contacts. It will thus be seen that satisfactory connection relies on compressive forces. Initial pressure on I.C. package 31 is created when the retaining clip 32 is snapped into place onto positioning frame 20 and is maintained thereafter by the compressed pressure pad 38 which is confined within the connector assembly 10. If for any reason these forces are substantially decreased, contact resistances would tend to increase until an open condition would be encountered.

One cause which contributes to a decrease in compressive forces in connector 10 is cold flow or compression set for the elastomeric pressure pad 38. In this condition, pressure pad 38 ultimately exerts no pressure against the top of I.C. carrier 31 since the compressed condition of pressure pad 38 becomes its "normal" condition. Cold flow or compression set of the elastomeric pressure pad material can be avoided by utilizing one of the more highly cross-linked elastomers.

A second cause of pressure decrease has been determined to be fastener leg creep, i.e., the legs 12 of fastener 11 were found to literally creep out of the solder. This action reduces contact pressure by decreasing compression of pressure pad 38. I have found that fastener leg creep can be avoided by forming a simple mechanical hook (see FIG. 2) in the legs 12 of fastener 11 and soldering over the hook during assembly of the fastener to printed circuit board 40.

There has been described herein a connector which is small in size to permit high packaging densities, provides for easy carrier replacement, has high insertion and withdrawal capability and low installation expense. Its reliability has been found to be high over a wide range of temperature and humidity and under varying conditions of vibration, shock, salt spray and other environmental conditions.

What is claimed is:

1. A connector for the discrete connection of close-spaced contact pads on a leadless integrated circuit carrier to traces on a printed circuit board, said traces including a central electrically isolated pad from which the other traces radiate outwardly in spaced relationship, said connector comprising a metallic fastener adapted to be secured to said circuit board and to nestably receive an insulating carrier positioning frame and a leadless integrated circuit carrier inserted therein, an electrically conductive elastomer sheet disposed within said positioning frame and interposed between said leadless integrated circuit carrier and said circuit board, said leadless integrated circuit carrier being centrally supported by said central electrically isolated pad, and a retaining clip comprising a resilient metallic cover and a compressible pressure pad adapted to cover the entire top surface of said leadless integrated circuit carrier so that a uniform pressure is applied over said carrier top and on said underlying conductive elastomer sheet when said retaining clip is latched over said positioning frame and onto said fastener to thereby establish electrical interconnection between the pads on the leadless integrated circuit carrier and the spaced traces of the circuit board.

2. A connector according to claim 1 wherein said conductive elastomer sheet is a functionally homogeneous composite comprising metal particles dispersed throughout a polymeric binder.

3. A connector according to claim 2 wherein said conductive elastomer sheet contains between about 2.5 to about 5 volume percent spherical nickel particles having a particle size of from about 0.006 to about 0.009 inch diameter dispersed in a silicone polymer.

4. A connector according to claim 1 wherein said compressible pressure pad is secured to said resilient cover.

5. A connector according to claim 4 wherein said compressible pressure pad is an elastomer having a Shore "A" Durometer value of from about 40 to about 50 and is compressed about 8 to 10 percent of its thickness when the retaining clip is latched.

6. A connector according to claim 1 wherein said fastener is mechanically secured to said circuit board.

* * * * *